(12) United States Patent
Kawasaki et al.

(10) Patent No.: US 6,704,369 B1
(45) Date of Patent: Mar. 9, 2004

(54) APPARATUS AND METHOD FOR SIGNAL SEPARATION AND RECORDING MEDIUM FOR THE SAME

(75) Inventors: Naoto Kawasaki, Fukuoka (JP); Hirokazu Shimada, Fukuoka (JP); Tsuyoshi Usagawa, Kumamoto-ken (JP); Yasuyuki Shimada, Kumamoto (JP); Masanao Ebata, Kumamoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 740 days.

(21) Appl. No.: 09/595,972

(22) Filed: Jun. 16, 2000

(30) Foreign Application Priority Data

Aug. 16, 1999 (JP) .......................................... 11-229651

(51) Int. Cl.$^7$ ............................................. H04B 15/00
(52) U.S. Cl. ....................... 375/285; 375/316; 375/346; 455/307; 381/94.1
(58) Field of Search ................................ 375/229, 232, 375/233, 285, 346, 349, 316, 340, 348; 455/295, 296, 303, 307, 312, 313; 704/228; 381/94.1

(56) References Cited

U.S. PATENT DOCUMENTS

| | | | | |
|---|---|---|---|---|
| 5,208,786 A | * | 5/1993 | Weinstein et al. | 367/124 |
| 5,539,832 A | * | 7/1996 | Weinstein et al. | 381/94.1 |
| 5,675,659 A | * | 10/1997 | Torkkola | 381/94.1 |
| 5,909,646 A | * | 6/1999 | Deville | 455/313 |
| 5,999,956 A | * | 12/1999 | Deville | 703/322 |
| 6,343,268 B1 | * | 1/2002 | Balan et al. | 704/228 |
| 6,577,675 B2 | * | 6/2003 | Lindgren et al. | 375/148 |

OTHER PUBLICATIONS

Ehud Weinstein, et al., "Multi–Channel Signalk Separation by Decorrelation," *IEEE Transactions on Speech and Audio Processing*, vol. 1, No. 4, pp. 405–413, Oct. 1993.

* cited by examiner

*Primary Examiner*—Chieh M. Fan
(74) *Attorney, Agent, or Firm*—Venable LLP; Catherine M. Voorhees

(57) ABSTRACT

A signal separation apparatus is capable of extracting original signals of two different systems with a high quality from received signals containing the original signals superposed each other in the course of transmission. In signal transmission from senders to receiver equipment, the signals to be sent separately are susceptible to mutual interference and superposition with given amplification factors in the course of transmission through respective transmission channels to such an extent that these signals can no more be discerned from each other by a receiver. For restoring the original signals of different sources from the received signals with high fidelity, characteristics of the transmission channels are estimated by means of an evaluation function unit operable with autocorrelation calculation, and the characteristics of filter elements of a signal separation circuit incorporated in the signal separation apparatus are determined on the basis of the results of the estimation to thereby allow the original signals of two sources to be restored from the mutually superposed state.

6 Claims, 6 Drawing Sheets

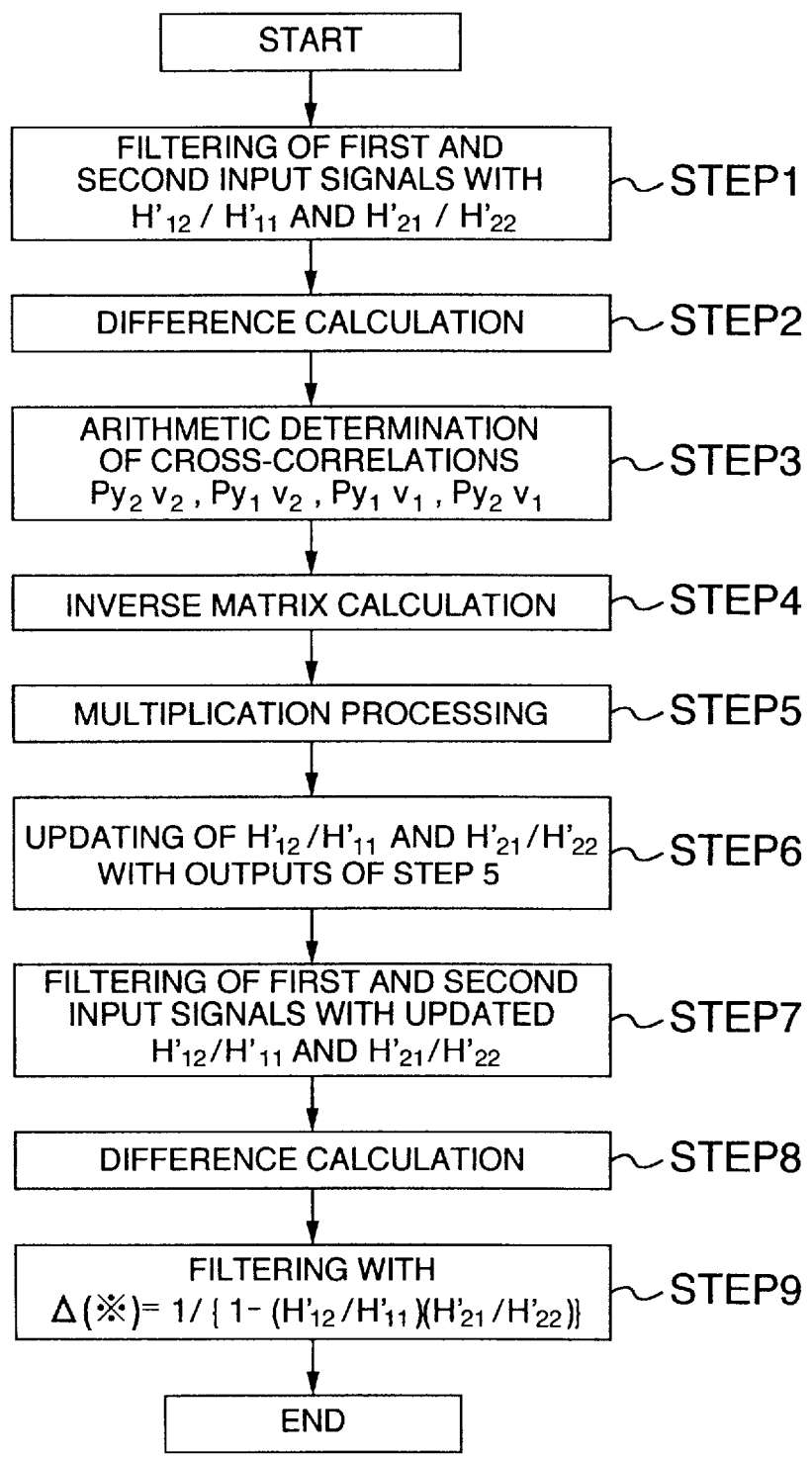

APPARATUS AND METHOD FOR SIGNAL SEPARATION AND RECORDING MEDIUM FOR THE SAME

BACKGROUND OF THE INVENTION

The present invention relates generally to signal processing techniques. More particularly, the invention is concerned with a method and an apparatus for performing signal separation processings and a medium recording the signal separation method in the form of a program executable with a computer.

In recent years, a human interface has been spotlighted according to the progress of computerization of consumer products. Especially, a hands-free operation is preferred in the case of the car navigation system for safety and convenience, so that the expectation is increasing for a speech recognition system within a surrounding noise. As well known, a surrounding noise degrades the performance of speech recognizer dramatically. To overcome this problem, the noise cancellers based on an adaptive algorithm such as LMS are used. Although they are effective when the system between noise source and observation is stable and noise is separately measurable, their performance degrades if measurement of noise is not precise or a transfer system is unstable.

The blind signal separation or blind noise canceller that does not require any reference noise signal, is preferred for these applications. There are several approaches to build blind signal separation systems. Because those alogrithms based on the gradient algorithm for convergence, there is a similar problem on local minimums on cost function. Also, these algorithms use high order statistics, so that the computational load is not small.

In this paper, a new simple signal separation method is proposed, for example. This method separates signals using the information on relative relationship between source signals.

In transmission of signals originating in different signal sources or systems, there may arise such situation that these signals undergo mutual interference or superposition with given amplification factors in the course of transmission to such extent that they can not be discriminated by the receiver, as exemplified by crosstalk phenomenon. For coping with this problem, there has heretofore been known a technique for performing signal separation processing on the received signals with a view to restoring the original signals from the mutually superposed state. With the conventional signal separation technique, the original signals of two discrete signal sources or systems sent through transmission line(s) or channels and received in mutually indiscernible state can certainly be restored approximately to the original sgnals.

For better understanding of the concept underlying the present invention, description will first be made in some detail of the conventional signal separation technique by reference to FIG. 5 of the accompanying drawings which shows in a functional block diagram a typical one of the signal separation apparatuses known heretofore.

The signal separation apparatus shown in FIG. 5 includes a signal separation means or unit and a transmission channel characteristics estimation means or unit. In the figure, reference numeral 1 denotes a first filter element or module of a variable tap coefficient type for performing filtering operation or processing on an input signal received from the transmission path or channel and originating in a first signal source or system (hereinafter referred to as the first input signal) with a given tap coefficient value, numeral 2 denotes a second filter element or module of a variable tap coefficient type for performing filtering operation or processing on an input signal received from the transmission channel and originating in a second signal source or system (hereinafter referred to as the second input signal) with a given tap coefficient value, numeral 3 denotes a difference calculation module for arithmetically determining a difference between the second input signal and the output signal of the first filter module 1, numeral 4 denotes a difference calculation module for arithmetically determining a difference between the first input signal and the output signal of the second filter module 2, numeral 5 denotes a third filter element or module of a variable tap coefficient type for performing filtering operation or processing on the output signal of the difference calculation module 3 with a given tap coefficient value, numeral 6 denotes a fourth filter element or module of a variable tap coefficient type for performing filtering processing on the output signal of the difference calculation module 4 with a given tap coefficient value, numeral 7 denotes a first cross-correlation calculation module for arithmetically determining cross-correlation between the second input signal and the output signal of the difference calculation module 3, numeral 8 denotes a second cross-correlation calculation module for arithmetically determining cross-correlation between the first input signal and the output signal of the difference calculation module 3, numeral 9 denotes a third cross-correlation calculation module for arithmetically determining cross-correlation between the second input signal and the output signal of the difference calculation module 4, numeral 10 denotes a fourth cross-correlation calculation module for arithmetically determining cross-correlation between the first input signal and an output signal of the difference calculation module 4, numeral 11 denotes a first inverse function calculation module for arithmetically determining an inverse function of the output signal of the first cross-correlation calculation module 7, numeral 12 denotes a second inverse function calculation module for arithmetically determining an inverse function of the output signal of the third cross-correlation calculation module 9, numeral 13 denotes a first multiplication module for determining a product of output signals of the first inverse function calculation module 11 and the second cross-correlation calculation module 8, and numeral 14 denotes a second multiplication module for determining a product of the output signals of the second inverse function calculation module 12 and the fourth cross-correlation calculation module 10. As can be seen in FIG. 5, the signal separation unit is comprised of the first and second filter elements or modules 1 and 2, the first and second difference calculation modules 3 and 4 and the third and fourth filter modules 5 and 6, while the transmission channel characteristics estimation unit is constituted by the first to fourth cross-correlation calculation modules 7 to 10, the first and second inverse function calculation modules 11 and 12, and the first and second multiplication modules 13 and 14.

Next, referring to FIG. 6, description will be directed to operation of the conventional signal separation apparatus of the structure shown in FIG. 5.

For convenience of the description, the original signals of two different signal sources or systems are represented in terms of the time-based notation as follows.

$$s_1(t) \qquad \text{(Exp. 14)}$$

$$s_2(t) \qquad \text{(Exp. 15)}$$

The signals mentioned above undergo distortions in the course of transmission through respective transmission channels due to characteristics thereof, which may be represented in terms of the frequency-based notation as follows.

$H_{11}(\omega)$ (Exp. 16)

$H_{21}(\omega)$ (Exp. 17)

$H_{12}(\omega)$ (Exp. 18)

$H_{22}(\omega)$ (Exp. 19)

Further, the signals transmitted through the transmission channels of the characteristics represented by the expressions Exp.16 to Exp.19 (such as direct path $H_{11}(\omega)$ and $H_{22}(\omega)$, corss-talk path $H_{21}(\omega)$ and $H_{12}(\omega)$) are represented by $x_1(t)$ (Exp. 20)

$x_2(t)$ (Exp. 21)

On the other hand, the first and second input signals supplied to the signal separation unit and the transmission channel characteristics estimation unit are represented by $y_1(t)$ (Exp. 22)

$y_2(t)$ (Exp. 23)

Furthermore, signals resulting from the Fourier transformation of the above-mentioned signals (Exp. 14 to Exp. 23) are represented as follows.

$S_1(\omega)$ (Exp. 24)

$S_2(\omega)$ (Exp. 25)

$X_1(\omega)$ (Exp. 26)

$X_2(\omega)$ (Exp. 27)

$Y_1(\omega)$ (Exp. 28)

$Y_2(\omega)$ (Exp. 29)

Then, the following expressions Exp.30, Exp.31, Exp.32 and Exp.33 apply valid.

$$S(\omega) = \begin{bmatrix} S_1(\omega) \\ S_2(\omega) \end{bmatrix} \quad \text{(Exp. 30)}$$

$$X(\omega) = \begin{bmatrix} X_1(\omega) \\ X_2(\omega) \end{bmatrix} = \begin{bmatrix} H_{11}(\omega)S_1(\omega) \\ H_{22}(\omega)S_2(\omega) \end{bmatrix} \quad \text{(Exp. 31)}$$

$$H(\omega) = \begin{bmatrix} H_{11}(\omega) & H_{12}(\omega) \\ H_{21}(\omega) & H_{22}(\omega) \end{bmatrix} \quad \text{(Exp. 32)}$$

$$Y(\omega) = \begin{bmatrix} Y_1(\omega) \\ Y_2(\omega) \end{bmatrix} = HS \quad \text{(Exp. 33)}$$
$$= \begin{bmatrix} H_{11}(\omega) & H_{12}(\omega) \\ H_{21}(\omega) & H_{22}(\omega) \end{bmatrix} \begin{bmatrix} S_1(\omega) \\ S_2(\omega) \end{bmatrix}$$
$$= \begin{bmatrix} H_{11}(\omega)S_1(\omega) + H_{12}(\omega)S_2(\omega) \\ H_{21}(\omega)S_1(\omega) + H_{22}(\omega)S_2(\omega) \end{bmatrix}$$

At this juncture, it is presumed that values which can be represented by the undermentioned expressions Exp.34 and Exp.35 are set as the initial tap coefficient values for the filter modules 1 and 2, respectively, whereon the filtering operation or processing is performed on the first and second input signals. Refer to FIG. 6, step 1.

$$\frac{H'_{21}(\omega)}{H'_{22}(\omega)} \quad \text{(Exp. 34)}$$

$$\frac{H'_{12}(\omega)}{H'_{11}(\omega)} \quad \text{(Exp. 35)}$$

The difference calculation module 3 is designed to arithmetically determine the difference between the second input signal and the output signal of the first filter module 1, while the difference calculation module 4 is designed to arithmetically determine the difference between the first input signal and the output signal of the second filter module 2. See the step 2 in FIG. 6. In this conjunction, the output signal of the difference calculation module 4 is represented by the undermentioned expression Exp. 36 in the time-based notation with the output signal of the difference circulation module 3 being represented by the undermentioned expression Exp. 37, while they are given by the expressions Exp. 38 and Exp. 39 in terms of the frequency-based notation.

$v_1(t)$ (Exp. 36)

$v_2(t)$ (Exp. 37)

$V_1(t)$ (Exp. 38)

$V_2(t)$ (Exp. 39)

The first cross-correlation calculation module 7 is designed to determine the cross-correlation between the second input signal and the output signal of the difference calculation module 3 on the frequency base, the second cross-correlation calculation module 8 determines the cross-correlation between the first input signal and the output signal of the first difference calculation module 3 on the frequency base, the third cross-correlation calculation module 9 determines the cross-correlation between the second input signal and the second output signal of the difference calculation module 4 on the frequency base, and the fourth cross-correlation calculation module 10 is designed to determine cross-correlation between the first input signal and the output signal of the second difference calculation module 4 on the frequency base. See step 3 in FIG. 6. The cross-correlation values as determined through the arithmetic operations mentioned above can be given by the following expressions Exp.40, Exp.41, Exp.42 and Exp.43.

$Py_2v_2(\omega)=E[Y_2(\omega)\cdot V_2(\omega)]$ (Exp. 40)

$Py_1v_2(\omega)=E[Y_1(\omega)\cdot V_2(\omega)]$ (Exp. 41)

$Py_2v_1(\omega)=E[Y_2(\omega)\cdot V_1(\omega)]$ (Exp. 42)

$Py_1v_1(\omega)=E[Y_1(\omega)\cdot V_1(\omega)]$ (Exp. 43)

On the other hand, the first inverse function calculation module 11 is designed to determine an inverse function of the output value (see Exp.40) of the first cross-correlation calculation module 7. The inverse function may be given by the undermentioned expression Exp.44. Similarly, the second inverse function calculation module 12 is designed to determine an inverse function of the output value (see Exp.42) of the third cross-correlation calculation module 9. The resulting inverse function may be given by the undermentioned expression Exp.45. Also see step 4 in FIG. 6.

$Py_2v_2^{-1}(\omega)$ (Exp. 44)

$Py_2v_1^{-1}(\omega)$ (Exp. 45)

Furthermore, the first multiplication module 13 serves to determine a product of the output signal (see Exp.44) of the first inverse function calculation module 11 and the output signal (see Exp.41) of the second cross-correlation calculation module 8, while the second multiplication module 14 determines the product of the output signal (Exp.45) of the second inverse function calculation module 12 and the output signal (Exp.43) of the fourth cross-correlation calculation module 10 (step 5 in FIG. 6), whereon the respective products (Exp.46, Exp.47) as determined are employed as the estimated values (see Exp.35 and Exp.34) of filter characteristics intrinsic to the transmission lines or channels for thereby updating the filter tap coefficient values of the first filter module 1, the second filter module 2, the third filter module 5 and the fourth filter module 6, respectively, in terms of the time-based notation value. See step 6 in FIG. 6.

$$\frac{H_{21}(\omega)}{H_{22}(\omega)} \quad \text{(Exp. 46)}$$

$$\frac{H_{12}(\omega)}{H_{11}(\omega)} \quad \text{(Exp. 47)}$$

The first filter module 1 and the second filter module 2 perform filtering processings on the first and second input signals (Exp.22 and Exp.23) supplied to the signal separation unit with respective filter tap coefficient values equivalent to the frequency-based notation values derived from the expressions Exp.34 and Exp.35. Step 7 in FIG. 6.

The difference calculation modules 3 determines arithmetically the difference between the second input signal (Exp.23) and the output signal of the filter module 1 while the difference calculation module 4 determines the difference between the first input signal (Exp.22) and the output signal of the filter module 2. Step 8 in FIG. 6.

The third filter module 5 performs filtering processing on the output signal (Exp.36) of the difference calculation module 3 with the tap coefficient value equivalent to the frequency-based notation of the value given by the undermentioned expression Exp.48 while the fourth filter module 6 performs filtering processing on the output signal (Exp.37) of the difference calculation module 4 with the tap coefficient value equivalent to the time-based notation of the value given by the following expression Exp.48. Step 9 in FIG. 6.

$$\frac{1}{1 - \frac{H'_{12}(\omega)H'_{21}(\omega)}{H'_{11}(\omega)H'_{22}(\omega)}} \quad \text{(Exp. 48)}$$

The conventional signal separation apparatus of the arrangement described above however suffers a problem that the indirect waves (crosstalk components) ascribable to the characteristics parameters represented by the expressions Exp.46 and Exp.47 can not be estimated in the case where zero-points make appearance in the transfer functions (Exp.16 and Exp.19) for the direct wave.

SUMMARY OF THE INVENTION

In the light of the state of the art described above, it is an object of the present invention to provide a signal separation methods, apparatuses and signal storage mediums, which enable extracting original signals of two different systems or sources with high quality and fidelity from the signals transferred from transmission channels even when the original signals have been distorted or superposed in the course of transmission.

In view of the above and other objects which will become apparent as the description proceeds, the present invention is directed to a signal separation apparatus for restoring first and second original signals at receiver equipment, even when these signals have undergone mutual interference or superposition with given amplification factors in the course of transmission to the receiver equipment through transmission channels and thus can not straightforwardly be discriminated by a receiver.

According to an aspect of the present invention, there is provided a signal separation apparatus for separating first and second input signals originating in two discrete signal systems at receiver equipment, which apparatus is comprised of a signal separation section and an evaluation function calculation section, wherein the signal separation section includes first and second filter module each of a variable tap coefficient type for performing filtering processing on the first input signal; third and fourth filter modules each of a variable tap coefficient type for performing filtering processing on the second input signal; a first difference calculation module for determining arithmetically difference between outputs of the first and third filter modules, respectively; a second difference calculation module for determining arithmetically difference between outputs of the second and fourth filter modules, respectively; a fifth filter module of a variable tap coefficient type for performing filtering processing on an output signal of the first difference calculation module; and a sixth filter module of a variable tap coefficient type for performing filtering processing on an output signal of the second difference calculation module; and wherein the evaluation function calculation section includes a first autocorrelation calculation module for determining arithmetically an inverse sign value of autocorrelation of an output signal of the fifth filter module; a second autocorrelation calculation module for determining arithmetically an inverse sign value of autocorrelation of the output signal of the sixth filter module, an addition module for adding together output values of the first and second autocorrelation calculation modules; an absolute value calculation module for determining an absolute value of the output value of the addition module; a square calculation module for determining arithmetically a squared value of the absolute value outputted from the absolute value calculation module; and a minimum value decision module for determining characteristics values of said transmission channels to obtain a minimum value from evaluation function values determined arithmetically with respect to optional characteristics values of said transmission channels.

Further, with the teachings of the present invention, there is provided an algorithm system which allows estimation of the indirect waves (crosstalk components) even in the case where the transfer function of the direct wave has zero point(s) and which makes it possible to perform signal separation processings on the two input signals originating in two different signal sources or systems even when the two input signals have been superposed mutually on the way of transmission due to crosstalks and even when the transfer function of the direct wave has the zero point(s).

Thus, according to further aspects of the present invention, there are provided the followings apparatus, methods and recording mediums as recited in claims.

There is provided an apparatus of claim 2, i.e., a signal separation apparatus according to the above-mentioned aspect, wherein said minimum value is selected by said minimum value decision means to determine components $\theta'(\omega)$—(Exp.1)—and $\phi'(\omega)$—(Exp.2)—in a predetermined range delimited by $-\pi/2$ and $\pi/2$ inclusive—(Exp.3)—, whereby the tap coefficients of said filter means are updated in dependence on the selected components $\theta'(\omega)$ and $\phi'(\omega)$.

There is still provided a method of claim 3, i.e., a method of separating first and second sequence signals input from transmission channels or paths, comprising the steps of:

(a) performing filtering proceedings on said first and second input signals with first, second, third and fourth filter means having respective controllable tap coefficient values in a frequency-based notation;

(b) performing difference calculation processings on output signals of said first filter means and said third filter means by first difference calculation means while performing difference calculation proceedings on output signals of said second filter means and said fourth filter means by second difference calculation means;

(c) performing filtering processing on output signals of said first and second difference calculation means, respectively, by fifth and sixth filter means each with a controllable tap coefficient value given by an undermentioned expression Exp.8;

(d) determining arithmetically an inverse sign value of autocorrelation of the output signal of said fifth filter means by first autocorrelation calculation means while determining arithmetically an inverse sign value of autocorrelation of the output signal of said sixth filter means by second autocorrelation calculation means;

(e) adding together output signals of the first and second autocorrelation calculation means determined values by addition means;

(f) determining arithmetically an absolute value of an output signal of said addition means by absolute value calculation means;

(g) determining arithmetically a square of the output absolute value of said absolute value calculation means by square calculation means;

(h) determining selectively a combination of tap coefficient values of said first, second, third and fourth filter means, respectively, so as to select a minimum evaluation function value in evaluation function values outputs of said square calculation means determined with optional tap coefficient values of said first, second, third and fourth filter means in the frequency-based notation;

(i) performing filtering processings by said first, second, third and fourth filter means with a combination of tap coefficient values determined in said step (h);

(j) performing difference calculation processing on the output signals of said first and third filter means by said first difference calculation means, while performing difference calculation processing on the output signals of said second and fourth filter means by said second difference calculation means; and (k) performing filtering processings on the output values of said first and second difference calculation means, respectively, by said fifth and sixth filter means each with an updated tap coefficient value, wherein said updated tap coefficient value mentioned in said step (k) is given by following expression:

$$\frac{1}{\alpha'_1(\omega)\alpha'_2(\omega) - \beta'_1(\omega)\beta'_2(\omega)} \qquad \text{(Exp. 8)}$$

where α2'(ω)—(Exp.4)—represents the tap coefficient value of said first filter means determined in said step (h), −β1'(ω)—(Exp.5)—represents the tap coefficient value of said second filter means determined in said step (h), −β2'(ω)—(Exp.6)—represents the tap coefficient value of said third filter means determined in step (h), α1'(ω)—(Exp.7)—represents the tap coefficient value of said fourth filter means determined in said step (h).

There is still provided a method of claim 4, i.e., a method of separating first and second sequence signals input from transmission channels or paths, comprising the steps of:

(a) performing filtering processings on said first and second input signals with first, second, third and fourth filter means having respective controllable tap coefficient values in a frequency-based notation;

(b) performing difference calculation processings on output signals of said first filter means and said third filter means by first difference calculation means while performing difference calculation processings on output signals of said second filter means and said fourth filter means by second difference calculation means;

(c) performing filtering processing on output signals of said first and second difference calculation means respectively by fifth and sixth filter means each with a tap controllable coefficient value given by an undermentioned expression Exp.13;

(d) determining arithmetically an inverse sign value of autocorrelation of the output signal of said fifth filter means by first autocorrelation calculation means while determining arithmetically an inverse sign value of autocorrelation of the output signal of said sixth filter means by second autocorrelation calculation means;

(e) adding together output signals of the first and second autocorrelation calculation means determined values by addition means;

(f) determining arithmetically an absolute value of an output signal of said addition means by absolute value calculation means;

(g) determining arithmetically a square of the output absolute value of said absolute value calculation means by square calculation means;

(h) determining selectively a combination of frequency components of tap coefficient values of said first, second, third and fourth filter means, respectively, within a predetermined range given by undermentioned expression Exp.3 so as to select a minimum evaluation function value in evaluation function values outputs of said square calculation means determined with optional tap coefficient values of said first, second, third and fourth filter means in the frequency-based notation;

(i) performing filtering processing by said first, second, third and fourth filter means with a combination of tap coefficient values determined in said step (h);

(j) performing difference calculation processing on the output signals of said first and third filter means by said first difference calculation means, while performing difference calculation processing on the output signals of said second and fourth filter means by said second difference calculation means; and (k) performing filtering processings on the output values of said first and second difference calculation means, respectively, by said fifth and sixth filter means each with the updated combination of tap coefficient value, wherein said updated tap coefficient value mentioned in said step (k) is given by the following expression:

$$\frac{1}{\cos\theta'(\omega)\cos\phi'(\omega) - \sin\theta'(\omega)\sin\phi'(\omega)} \qquad \text{(Exp. 13)}$$

where θ'(ω)—(Exp.1)—and φ'(ω)—(Exp.2)—represent the tap coefficient value frequency components said predetermined range recited in said step (h) is given by from −π/2 to π/2, inclusive—(Exp.3), cos φ'(ω)—(Exp.9)—represents the tap coefficient value of said first filter means determined in said step (h), −sin θ'(ω)—(Exp.10)—represents the tap coefficient value of said second filter means determined in said step (h), −sin φ'(ω)—(Exp.11)—represents the tap coefficient value of said third filter means determined in said step (h), and cos θ'(ω)—(Exp.12)—represents the tap coefficient value of said fourth filter means determined in said step (h).

There is still provided a medium of claim 5, i.e., a storage medium recording in the form of a program a signal separation method of processing by two-inputs system to separate two original sequence signals subjected to mutual superposition in transmission channel or paths, thereby restoring the original sequence signals, said method comprising steps of:

(a) performing filtering processings on said first and second input signals with first, second, third and fourth filter means having respective controllable tap coefficient values in a frequence-based notation;

(b) performing difference calculation processings on output signals of said first filter means and said third filter means by first difference calculation means while performing difference calculation proceedings on output signals of said second filter means and said fourth filter means by second difference calculation means;

(c) performing filtering processing on output signals of said first and second difference calculation means, respectively, by fifth and sixth filter means each with a controllable tap coefficient value given by an undermentioned expression Exp.8;

(d) determining arithmeitcally an inverse sign value of autocorrelation of the output signal of said fifth filter means by first autocorrelation calculation means while determining arithmetically an inverse sign value of autocorrelation of the output signal of said sixth filter means by second autocorrelation calculation means;

(e) adding together output signals of the first and second autocorrelation calculation determined values by addition means;

(f) determining arithmetically an absolute value of an output signal of said addition means by absolute value calculation means;

(g) determining arithmetically a square of the output absolute value of said absolute value calculation means by square calculation means;

(h) determining selectively a combination of tap coefficient values of said first, second, third and fourth filter means, respectively, so as to select a minimum evaluation function value in evaluation function values outputs of said square calculation means determined with optional tap coefficient values of said first, second, third and fourth filter means in the frequency-based notation;

(i) performing filtering processings by said first, second, third and fourth filter means with a combination of tap coefficient values determined in said step (h);

(j) performing difference calculation processing on the output signals of said first and third filter means by said first difference calculation means, while performing difference calculation processing on the output signals of said second and fourth filter means by said second difference calculation means; and (k) performing filtering processings on he output values of said first and second difference calculation means, respectively, by said fifth and sixth filter means each with the updated combination of tap coefficient value, wherein said updated tap coefficient value mentioned in said step (k)is given by following expression:

$$\frac{1}{\alpha'_1(\omega)\alpha'_2(\omega) - \beta'_1(\omega)\beta'_2(\omega)} \quad \text{(Exp. 8)}$$

where α2'(ω)—(Exp.4)—represents the tap coefficient value of said first filter means determined in said step (h), −β1'(ω)—(Exp.5)—represents the tap coefficient value of said second filter means determined in said step (h), −β2'(ω)—(Exp.6)—represents the tap coefficient value of said third filter means determined in said step (h), α1'(ω)—(Exp.7)—represents the tap coefficient value of said fourth filter means determined in said step (h).

There is still provided a medium of claim 6, i.e., a storage medium recording in the form of a program a signal separation method of processing by two-inputs system to separate two original sequence signals subjected to mutual superposition in transmission channel or paths, thereby restoring the original sequence signals, said method comprising steps of:

(a) performing filtering processings on said first and second input signals with first, second, third and fourth filter means having respective controllable tap coefficient values in a frequency-based notation;

(b) performing difference calculation processings on output signals of said first filter means and said third filter means by first difference calculation means while performing difference calculation processings on output signals of said second filter means and said fourth filter means by second difference calculation means;

(c) performing filtering processing on output signals of said first and second difference calculation means respectively by fifth and sixth filter means each with a tap controllable coefficient value given by an undermentioned expression Exp.13;

(d) determining arithmetically an inverse sign value of autocorrelation of the output signal of said fifth filter means by first autocorrelation calculation means while determining arithmetically an inverse sign value of autocorrelation of the output signal of said sixth filter means by second autocorrelation calculation means;

(e) adding together output signals of the first and second autocorrelation calculation means determined values by addition means;

(f) determining arithmetically an absolute value of an output signal of said addition means by absolute value calculation means;

(g) determining arithmetically a square of the output absolute value of said absolute value calculation means by square calculation means;

(h) determining selectively a combination of frequency components of tap coefficient values of said first, second, third and fourth filter means, respectively, within a predetermined range given by undermentioned expression Exp.3 so as to select a minimum evaluation function value in evaluation function values outputs of said square calculation means determined with optional tap coefficient values of said first, second, third and fourth filter means in the frequency-based notation;

(i) performing filtering processing by said first, second, third and fourth filter means with a combination of tap coefficient values determined in said step (h);

(j) performing difference calculation processing on the output signals of said first and third filter means by said first difference calculation means, while performing difference calculation processing on the output signals of said second and fourth filter means by said second difference calculation means; and (k) performing filtering processings on the output values of said first and second difference calculation means, respectively, by said fifth and sixth filter means each with the updated combination of tap coefficient value, wherein said updated tap coefficient value mentioned in said step (k) is given by the following expression:

$$\frac{1}{\cos\theta'(\omega)\cos\phi'(\omega) - \sin\theta'(\omega)\sin\phi'(\omega)} \quad \text{(Exp. 13)}$$

where $\theta'(\omega)$—(Exp.1)—and $\phi'(\omega)$—(Exp.2)—represent the tap coefficient value frequency components said predetermined range recited in said step (h) is given by from $-\pi/2$ to $\pi/2$, inclusive—(Exp.3), $\cos \phi'(\omega)$—(Exp.9)—represents the tap coefficient value of said first filter means determined in said step (h), $-\sin \theta'(\omega)$—(Exp.10)—represents the tap coefficient value of said second filter means determined in said step (h), $-\sin \phi'(\omega)$—(Exp.11)—represents the tap coefficient value of said third filter means determined in said step (h), and $\cos \theta'(\omega)$—(Exp.12)—represents the tap coefficient value of said fourth filter means determined in said step (h).

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIG. 6 is a flow chart for illustrating operation of the conventional signal separation apparatus.

DETAILED DESCRIPTION OF THE EMBODIMENTS

The present invention will be described in detail in conjunction with what is presently considered as preferred or typical embodiments thereof by reference to the drawings.

Embodiment 1

Figure 1:
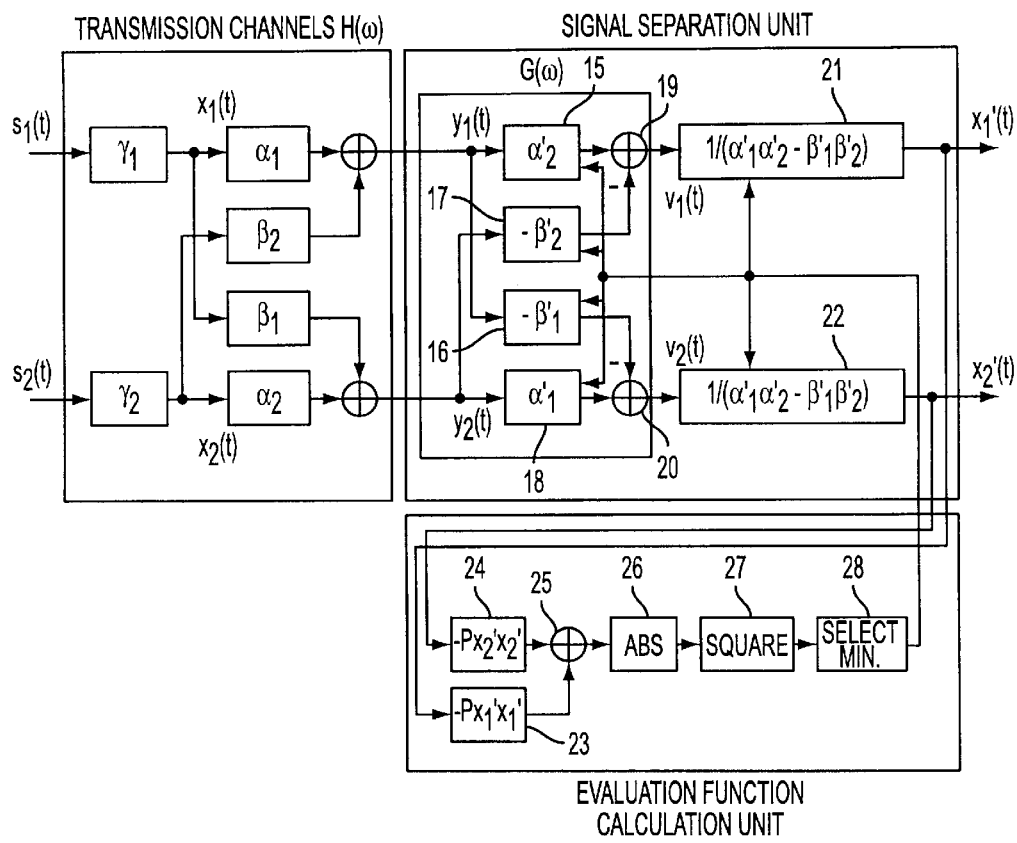
FIG. 1 is a functional block diagram showing schematically a structure of the signal separation apparatus according to a first embodiment of the present invention.

FIG. 1 is a functional block diagram showing schematically a structure of the signal separation apparatus according to a first embodiment of the present invention.

As described hereinbefore, in the signal transmission from signal sources to receiver equipment, there may arise such situation that first and second signals to be transmitted discretely to the receiver equipment undergo mutual superposition with certain amplification factors in the course of the transmission through respective transmission channels, as a result of which the first and second signals can not be discriminated from each other by the receiver. The purpose of the signal separation apparatus according to the present invention is to make it possible to restore or produce the first and second signals (original signals) with high fidelity at the receiver equipment. To this end, the signal separation apparatus according to the first embodiment of the present invention includes a signal separation unit constituted by a first filter module 15 for performing filtering processing on a first input signal with a given tap coefficient value, a second filter module 16 for performing filtering processing on the first input signal with a given tap coefficient value, a third filter module 17 for performing filtering processing on the second input signal with a given tap coefficient value, a fourth filter module 18 for performing filtering processing on the second input signal with a given tap coefficient value, a first difference calculation module 19 for arithmetically determining a finite difference (hereinafter referred to as the difference) between the output signals of the filter modules 15 and 17, a second difference calculation module 20 for arithmetically determining a difference between the output signals of the second filter module 16 and the fourth filter module 18, a fifth filter module 21 for performing filtering processing on the output signal of the first difference calculation module 19 with a given tap coefficient value and a sixth filter module 22 for performing filtering processing on the output signal of the second difference calculation module 20 with a given tap coefficient value. Further, the signal separation apparatus according to the instant embodiment of the invention includes an evaluation function calculation unit which is constituted by a first autocorrelation calculation module 23 for arithmetically determining an inverse sign value of autocorrelation for the output signal of the fifth filter module 21, a second autocorrelation calculation module 24 for arithmetically determining an inverse sign value of autocorrelation for the output signal of the sixth filter module 22, an addition module 25 for adding together the output signals of the autocorrelation calculation modules 23 and 24, an absolute value calculation module 26 for arithmetically determining the absolute value of the output signal of the addition module 25, a square calculation module 27 for arithmetically determining the square (i.e., squared value) of the output signal of the absolute value calculation module 26 and a minimum value decision (selection) module 28 for estimating an optimal transmission-channel transfer function value for the filter tap coefficients from the candidate values thereof.

Next, referring to the flow chart shown in FIG. 2, description will be made of operation of the signal separation apparatus shown in FIG. 1.

For convenience of the description, it is presumed that original signals of two sequence signal sources or systems are represented in terms of the time-based notation as follows:

$$s_1(t) \quad \text{(Exp. 14)}$$

$$s_2(t) \quad \text{(Exp. 15)}$$

It is also presumed that these first and second signals undergo distortions in the course of transmission through the respective transmission channels due to filtering factors thereof which are represented in the frequency-based notation as follows:

$$\alpha_1(\omega) \quad \text{(Exp. 49)}$$

$$\alpha_2(\omega) \quad \text{(Exp. 50)}$$

$\beta_1(\omega)$ (Exp. 51)

$\beta_2(\omega)$ (Exp. 52)

$\gamma_1(\omega)$ (Exp. 53)

$\gamma_2(\omega)$ (Exp. 54)

Further, the first and second signals having passed through the transmission channels section (Exp.53 and Exp.54) are represented in the time-based notation by $x_1(t)$ (Exp. 20)

$x_2(t)$ (Exp. 21)

Furthermore, the input signals to the signal separation unit are represented in the time-based notation as follows:

$y_1(t)$ (Exp. 22)

$y_2(t)$ (Exp. 23)

Finally, signals resulting from the Fourier transformation of the above-mentioned signals are represented as follows:

$S_1(\omega)$ (Exp. 24)

$S_2(\omega)$ (Exp. 25)

$X_1(\omega)$ (Exp. 26)

$X_2(\omega)$ (Exp. 27)

$Y_1(\omega)$ (Exp. 28)

$Y_2(\omega)$ (Exp. 29)

At this juncture, for enabling comparison with the arrangement shown in FIG. 5, the transmission channel filtering factors $\gamma_1$ (Exp.53), $\gamma_2$ (Exp.54), $\alpha_1$ (Exp.49), $\beta_1$ (Exp.51), $\alpha_2$ (Exp.50) and $\beta_2$ (Exp.52) mentioned above are defined as follows.

$$\gamma_1(\omega) = \sqrt{H_{11}(\omega)^2 + H_{21}(\omega)^2} \quad \text{(Exp. 55)}$$

$$\gamma_2(\omega) = \sqrt{H_{12}(\omega)^2 + H_{22}(\omega)^2} \quad \text{(Exp. 56)}$$

$$\alpha_1(\omega) = \frac{H_{11}(\omega)}{\gamma_1(\omega)} \quad \text{(Exp. 57)}$$

$$\beta_1(\omega) = \frac{H_{21}(\omega)}{\gamma_1(\omega)} \quad \text{(Exp. 58)}$$

$$\alpha_2(\omega) = \frac{H_{22}(\omega)}{\gamma_2(\omega)} \quad \text{(Exp. 59)}$$

$$\beta_2(\omega) = \frac{H_{12}(\omega)}{\gamma_2(\omega)} \quad \text{(Exp. 60)}$$

Figure 5:
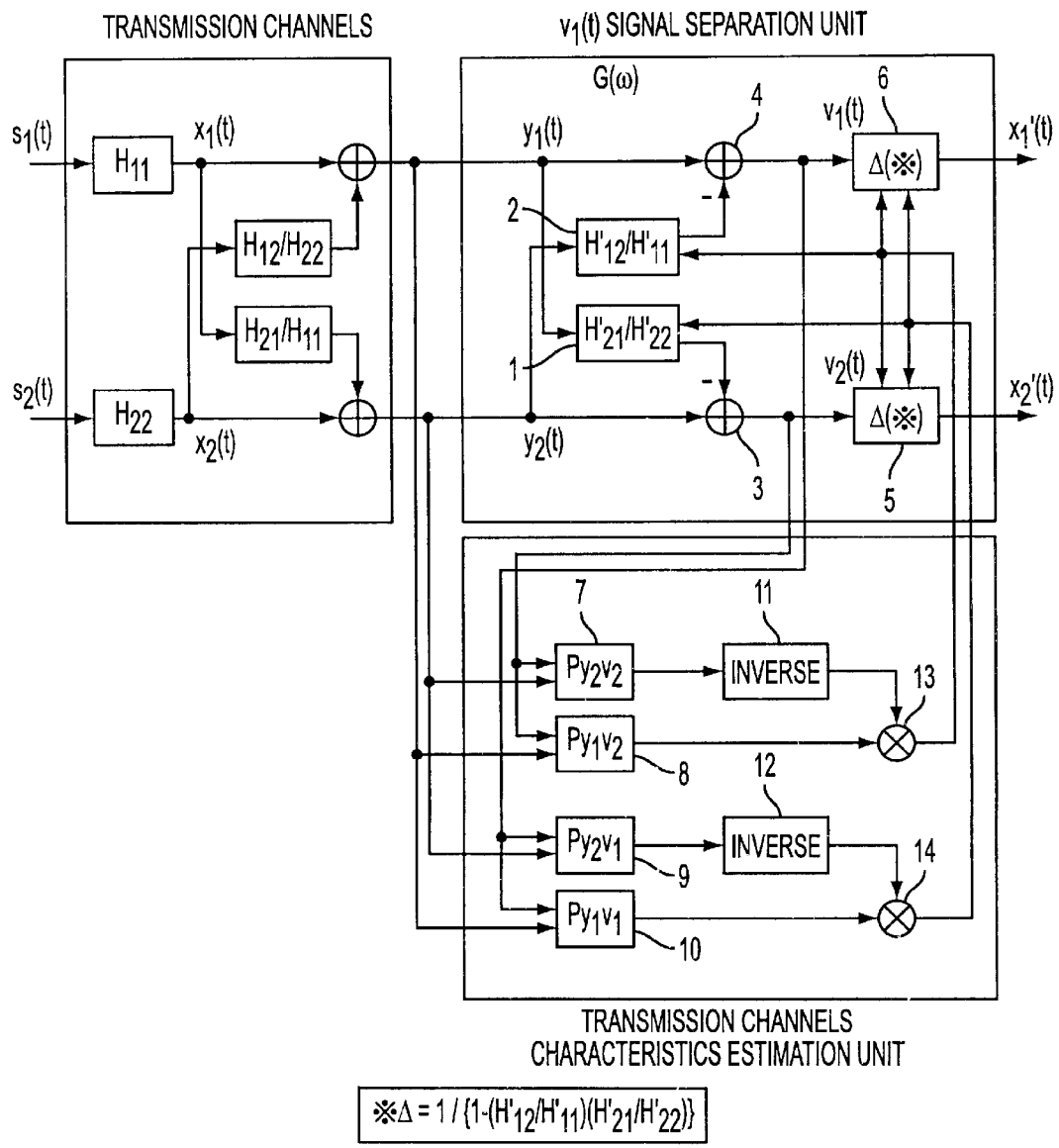
FIG. 5 is a functional block diagram showing a conventional signal separation apparatus known heretofore.

Furthermore, similarly to the expressions Exp.31 and Exp.32 mentioned hereinbefore by reference to FIGS. 5 and 6, following expressions Exp.61 and Exp.62 can be derived.

$$X(\omega) = \begin{bmatrix} X_1(\omega) \\ X_2(\omega) \end{bmatrix} = \begin{bmatrix} \gamma_1(\omega)S_1(\omega) \\ \gamma_2(\omega)S_2(\omega) \end{bmatrix} \quad \text{(Exp. 61)}$$

$$H(\omega) = \begin{bmatrix} H_{11}(\omega) & H_{12}(\omega) \\ H_{21}(\omega) & H_{22}(\omega) \end{bmatrix} \quad \text{(Exp. 62)}$$

$$= \begin{bmatrix} \alpha_1(\omega) & \beta_2(\omega) \\ \beta_1(\omega) & \alpha_2(\omega) \end{bmatrix} \begin{bmatrix} \gamma_1(\omega) & 0 \\ 0 & \gamma_2(\omega) \end{bmatrix}$$

At this juncture, by defining $F(\omega)$ as follows:

$$F(\omega) = \begin{bmatrix} \alpha_1(\omega) & \beta_2(\omega) \\ \beta_1(\omega) & \alpha_2(\omega) \end{bmatrix} \quad \text{(Exp. 63)}$$

the expression Exp. 64 mentioned below can be derived.

$$Y(\omega) = \begin{bmatrix} Y_1(\omega) \\ Y_2(\omega) \end{bmatrix} = F(\omega) \cdot X(\omega) \quad \text{(Exp. 64)}$$

It is assumed now that the inverse matrix represented by the undermentioned expression Exp. 65 is contained in the expression Exp. 63.

$$F^{-1}(\omega) \quad \text{(Exp. 65)}$$

Then, the expression Exp.61 representing the signals of two systems which are not superposed each other can be determined by multiplying the expression Exp. 64 by the inverse matrix, i.e., Exp. 65, beginning with the left side. Parenthetically, the inverse matrix (Exp. 65) can be expressed by the following expression Exp. 66:

$$F^{-1}(\omega) = \frac{1}{\Delta} \begin{bmatrix} \alpha_2(\omega) & -\beta_2(\omega) \\ -\beta_1(\omega) & \alpha_2(\omega) \end{bmatrix} \quad \text{(Exp. 66)}$$

where $$\Delta = \alpha_1(\omega)\alpha_2(\omega) - \beta_1(\omega)\beta_2(\omega) \neq 0. \quad \text{(Exp. 67)}$$

Now, a filter transfer function Exp. 68 for estimating the transfer function Exp. 63 given by the expression Exp.63 and the output thereof Exp. 69 are represented as follows:

$G'(\omega)$ (Exp. 68)

$X'(\omega)$ (Exp. 69)

Then, the following expression Exp.70 applies valid.

$$X'(\omega) = \begin{bmatrix} X_1'(\omega) \\ X_2'(\omega) \end{bmatrix} = G'(\omega) \cdot Y(\omega) \quad \text{(Exp. 70)}$$

$$= G'(\omega) \cdot F(\omega) \cdot X(\omega)$$

For enabling the signal separation, the conditions given by the undermentioned expression Exp.71 must be satisfied.

$$G'(\omega) \cdot F(\omega) \cdot X(\omega) = X(\omega) \quad \text{(Exp. 71)}$$

In order that the above expression Exp.71 holds true, then the expression Exp.72 mentioned below must apply valid.

$$G'(\omega) = F^{-1}(\omega) \quad \text{(Exp. 72)}$$

From the expressions Exp. 72, Exp.66, Exp. 67, the above expression Exp.72 can be rewritten as follows:

$$G'(\omega) = \frac{1}{\Delta} G(\omega) \quad \text{(Exp. 73)}$$

Thus, it becomes ultimately necessary to determine $$G(\omega) = \begin{bmatrix} \alpha_2(\omega) & -\beta_2(\omega) \\ -\beta_1(\omega) & \alpha_1(\omega) \end{bmatrix} \quad \text{(Exp. 74)}$$

The output signal of the filter given by the above expression Exp.74 is represented by $$V(\omega) \quad \text{(Exp. 75)}$$

Then, $V(\omega)$ can be given by the following expression Exp.76 by taking into consideration the expressions Exp.38 and Exp.39 in the frequency-based notation or the expressions Exp.36 and Exp.37 in the time-based notation.

$$V(\omega) = G(\omega) \cdot Y(\omega) \quad \text{(Exp. 76)}$$

Now, referring to the flow chart shown in FIG. 2, operation of the signal separation apparatus according to the first embodiment of the invention will be described.

In a step 10 shown in FIG. 2, the first filter module 15, the second filter module 16, the third filter module 17 and the fourth filter module 18 of the signal separation unit perform filtering processings on the first and second input signals transferred from the transmission channels section with given tap coefficient values which are represented as follows:

$$\alpha_2'(\omega) \quad \text{(Exp. 4)}$$

$$-\beta_1'(\omega) \quad \text{(Exp. 5)}$$

$$-\beta_2'(\omega) \quad \text{(Exp. 6)}$$

$$\alpha_1'(\omega) \quad \text{(Exp. 7)}$$

In this conjunction, it should be noted that at this time point, the filter components given by the expressions Exp.57, Exp.58, Exp.59 and Exp.60 mentioned previously are not yet taken into consideration in selection of the tap coefficient values represented by Exp.4, Exp.5, Exp.6 and Exp.7.

The first difference calculation module 19 determines arithmetically the difference between the output signals of the first filter module 15 and the third filter module 17. Similarly, the second difference calculation module 20 determines the difference between the output signals of the second filter module 16 and the fourth filter module 18. See step 11 in FIG. 2.

Subsequently, in a step 12, the fifth filter module 21 performs filtering processing on the output signal of the first difference calculation module 19, while the sixth filter module 22 performs the filtering processing on the output signal of the second difference calculation module 20. In that case, the filter tap coefficients of the filter modules 21 and 22 are represented by the frequency-based notation of the expression Exp.8:

$$\frac{1}{\alpha_1'(\omega)\alpha_2'(\omega) - \beta_1'(\omega)\beta_2'(\omega)} \quad \text{(Exp. 8)}$$

In this conjunction, the output signals of the fifth filter module 21 and the sixth filter module 22 are represented in the frequency-based notation as follows:

$$X_1'(\omega) \quad \text{(Exp. 77)}$$

$$X_2'(\omega) \quad \text{(Exp. 78)}$$

Further, in the time-based notation, they are represented by $$x_1'(t) \quad \text{(Exp. 79)}$$

$$x_2'(t) \quad \text{(Exp. 80)}$$

Furthermore, vector notation of the expressions Exp.77 and Exp.78 is represented by $$X'(\omega) = \begin{bmatrix} X_1'(\omega) \\ X_2'(\omega) \end{bmatrix} \quad \text{(Exp. 81)}$$

The filter modules 15 to 22 mentioned above cooperate to constitute the signal separation unit (means) of the apparatus according to the instant embodiment of the invention.

The first and second autocorrelation calculation modules 23 and 24 of the evaluation function calculation unit are designed to determine arithmetically autocorrelations of the output signals from the fifth and sixth filter modules 21 and 22, respectively, to thereby output the inverse sign values of the autocorrelation (step 13).

More specifically, the signals outputted from the first and second autocorrelation calculation modules 23 and 24 can be represented, respectively, by the following expressions Exp.82 and Exp.83.

$$-P_{x_1'x_1'}(\omega) = -E[X_1'(\omega) \cdot X_1'(\omega)] \quad \text{(Exp. 82)}$$

$$-P_{x_2'x_2'}(\omega) = -E[X_2'(\omega) \cdot X_2'(\omega)] \quad \text{(Exp. 83)}$$

Figure 2:
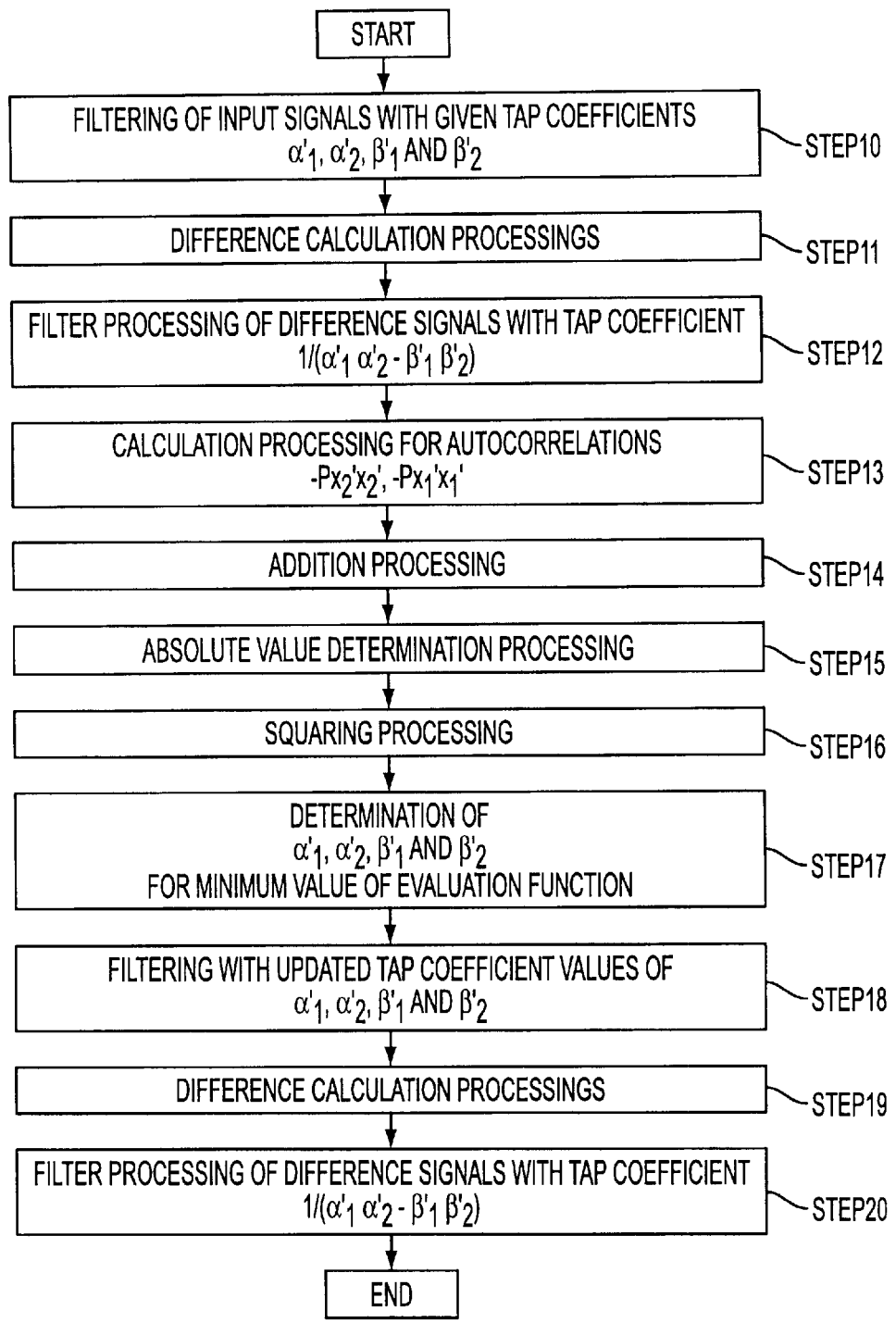
FIG. 2 is a flow chart for illustrating operation of the signal separation apparatus according to the first embodiment of the invention.

On the other hand, the addition module 25 determines a sum of the output signals (Exp.82 and Exp.83) of the first and second autocorrelation calculation modules 23 and 24 in a step 14 shown in FIG. 2. The absolute value calculation module 26 determines the absolute value of the output of the addition module 25 (step 15). The square calculation module 27 determines the square of the output of the absolute value calculation module 26 (step 16). Finally, the minimum value decision module 28 determines arithmetically a combination of the filter tap coefficient values represented by Exp.4, Exp.5, Exp.6 and Exp.7 for which the output signal of the square calculation module 27 can assume a minimum value (step 17). At this juncture, it should again be mentioned that the first and second autocorrelation calculation modules 23 and 24, the addition module 25, the absolute value calculation module 26, the square calculation module 27 and the minimum value decision module 28 cooperate to constitute the evaluation function calculation unit or means of the apparatus according to the invention. The output signal J of the evaluation function calculation unit can thus be defined as follows:

$$J = \min|-P_{x_1'x_1'}(\omega) - P_{x_2'x_2'}(\omega)|^2 \quad \text{(Exp. 84)}$$

The expression Exp.74 can be made determinant by the solution of the above expression Exp.84, whereby the superposed signals of two systems can be separated from each other.

Now, on the basis of the transfer functions of the transmission channels as determined by the evaluation function calculation unit (Exp. 84), the tap coefficients (Exp.4, Exp.5, Exp.6 and Exp.7) of the filter modules (15, 16, 17, 18) constituting the signal separation unit are updated correspondingly, whereon filtering processing is performed on the input signals (Exp.22 and Exp.23) of two systems by means of the filter modules 15, 16, 17 and 18 with the updated tap coefficients given by the frequency-based notation of the transfer functions. Step 18 in FIG. 2.

In succession, the first difference calculation module 19 determines arithmetically the difference between the output signals of the first filter module 15 and the third filter module 17, while the second difference calculation module 20 determines arithmetically the difference between the output signals of the second filter module 16 and the fourth filter module 18. See step 19 in FIG. 2.

Parenthetically, the processings in the steps 18 and 19 are equivalent to multiplication of the input signal (Exp.64) to the signal separation unit by the transfer function (Exp.74).

The fifth and sixth filter modules 21 and 22 perform filtering processings on the output signals of the first and second difference calculation modules 19 and 20 with the tap coefficients equivalent to the frequency-based notation of the expression Exp.8 (step 20).

Through the processings in the steps 18, 19 and 20, the undermentioned expression Exp.85 can be validated, starting from the expression Exp.70.

$$x'(\omega)=x(\omega) \tag{Exp. 85}$$

As can be seen from the above, separation of the mutually superposed signals of two systems can be realized.

As is apparent from the foregoing, according to the teachings of the present invention incarnated in the first embodiment, the signal separation processing can be realized even in the case where the transfer functions (Exp.16 and Exp.19) of the transmission channels for the direct waves have the zero point.

Embodiment 2

Figure 3:
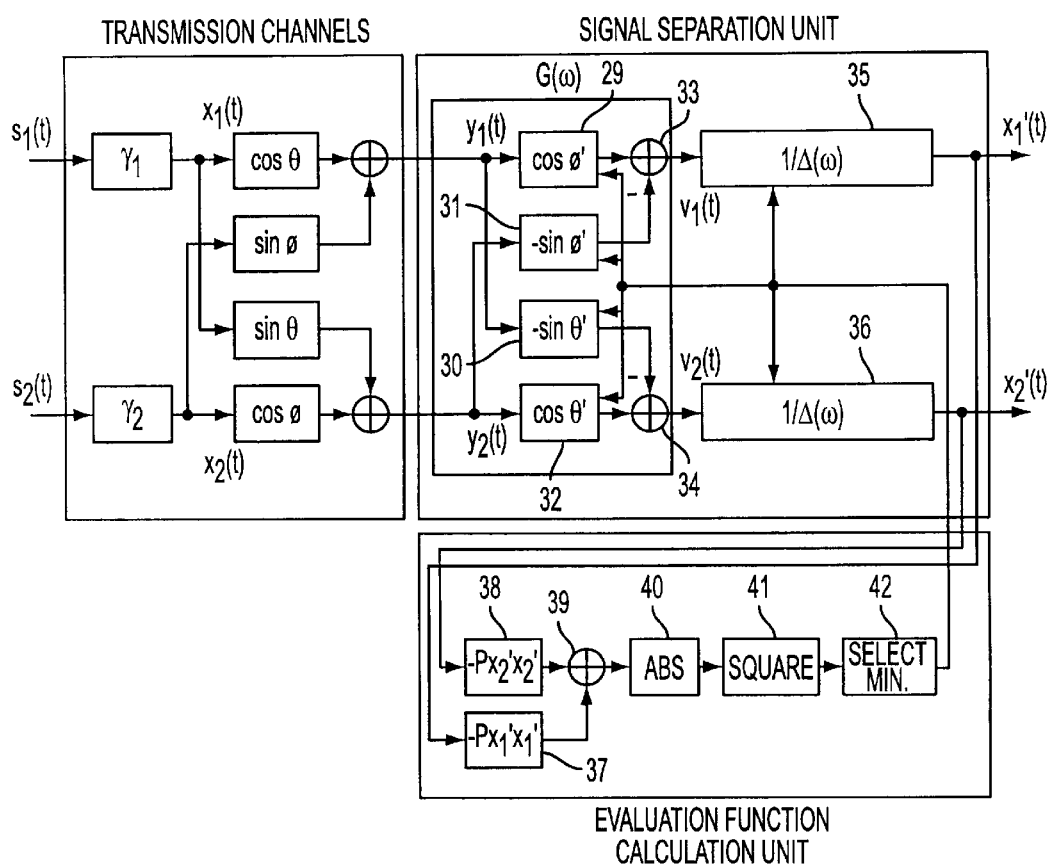
FIG. 3 is a functional block diagram showing schematically a structure of the signal separation apparatus according to a second embodiment of the present invention.

Description will now be made of the second embodiment of present invention. FIG. 3 is a functional block diagram showing a structure of the signal separation apparatus according to the second embodiment of the invention.

As described hereinbefore, in the signal transmission from signal sources to receiver equipment, first and second signals to be transmitted discretely to the receiver equipment may undergo mutual superposition with certain amplification factors in the course of the transmission through respective transmission channels to such extent that the first and second signals are unable to be discriminated from each other in the receiver equipment. To cope with this problem, the signal separation apparatus according to the second embodiment of the invention includes a signal separation unit which is comprised of a first filter module 29 for performing filtering processing on a first input signal with a given tap coefficient value, a second filter module 30 for performing filtering processing on the first input signal with a given tap coefficient value, a third filter module 31 for performing filtering processing on the second input signal with a given tap coefficient value, a fourth filter module 32 for performing filtering processing on the second input signal with a given tap coefficient value, a first difference calculation module 33 for arithmetically determining a difference between the output signals of the filter modules 29 and 31, a second difference calculation module 34 for arithmetically determining a difference between the output signals of the second filter module 30 and the fourth filter module 32, a fifth filter module 35 for performing filtering processing on the output signal of the first difference calculation module 33 with a given tap coefficient value and a sixth filter module 36 for performing filtering processing on the output input signal of the second difference calculation module 34 with a given tap coefficient value. Further, the signal separation apparatus includes an evaluation function calculation unit which is comprised of a first autocorrelation calculation module 37 for arithmetically determining an inverse sign value of autocorrelation for the output signal of the fifth filter module 35, a second autocorrelation calculation module 38 for arithmetically determining an inverse sign value of autocorrelation for the output signal of the sixth filter module 36, an addition module 39 for adding together the output signals of the first autocorrelation calculation module 37 and the second autocorrelation calculation module 38, an absolute value calculation module 40 for arithmetically determining the absolute value of the output signal of the addition module 39, a square calculation module 41 for arithmetically determining the squared value of the output signal of the absolute value calculation module 40, and a minimum value decision (selection) module 42 for estimating an optimal transmission channel transfer function value from the candidate values thereof.

Figure 4:
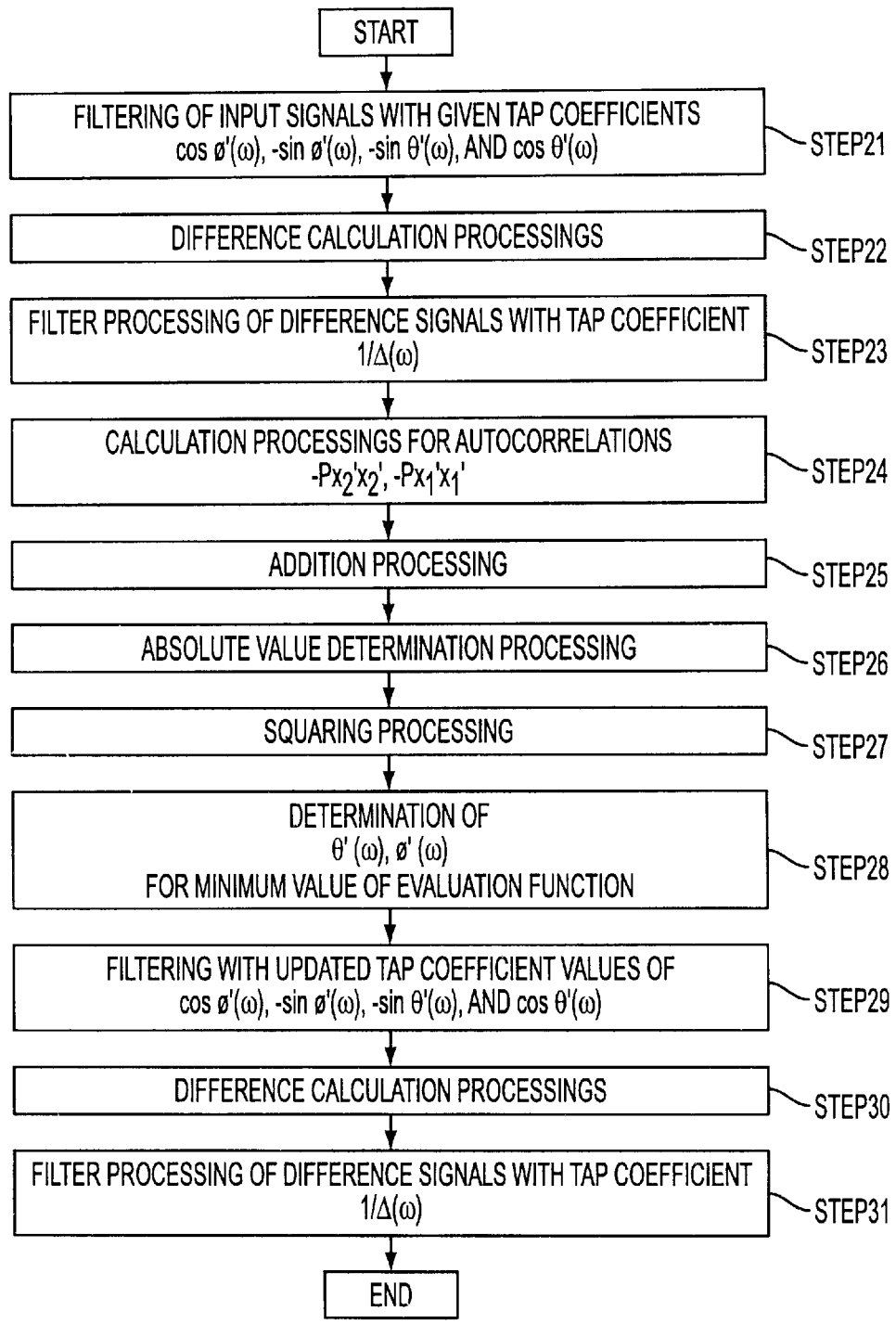
FIG. 4 is a flow chart for illustrating operation of the signal separation apparatus according to the second embodiment of the invention.

Next, referring to FIG. 4, description will be made of operation of the signal separation apparatus shown in FIG. 3.

For the signals transmitted through the transmission lines or channels, the expressions Exp.30, Exp.61 and Exp.62 mentioned hereinbefore can apply valid. However, in the case of the instant embodiment of the invention, the conditions given by the undermentioned expressions Exp.86 and Exp.87 are derived from the expressions Exp.55, Exp. 56, Exp.57, Exp.58, Exp.59 and Exp.60 mentioned hereinbefore.

$$|\alpha_1(\omega)|^2+|\beta_1(\omega)|^2=1 \tag{Exp. 86}$$

$$|\alpha_2(\omega)|^2+|\beta_2(\omega)|^2=1 \tag{Exp. 87}$$

Consequently, the expression Exp.63 can be rewritten as follows.

$$F(\omega) = \begin{bmatrix} \cos\theta(\omega) & \sin\phi(\omega) \\ \sin\theta(\omega) & \cos\phi(\omega) \end{bmatrix} \tag{Exp. 88}$$

where $$\cos\theta(\omega)=\alpha_1(\omega) \tag{Exp. 89}$$

$$\sin\theta(\omega)=\beta_1(\omega) \tag{Exp. 90}$$

$$\cos\phi(\omega)=\alpha_2(\omega) \tag{Exp. 91}$$

$$\sin\phi(\omega)=\beta_2(\omega) \tag{Exp. 92}$$

By expressing the transfer function in the form of trigonometric function, the optimal solution can be determined on a unit circle. In other words, the optimal solution can be obtained by searching over a finite range given by $$-\pi<\theta(\omega), \phi(\omega)\leq\pi \tag{Exp. 93}$$

Furthermore, for the received signal of direct waves, it is conceived that the conditions mentioned below apply valid.

$$\alpha_1(\omega)>0 \tag{Exp. 94}$$

$$\alpha_2(\omega)>0 \tag{Exp. 95}$$

In this case, the range for search of the optimal solution can be represented by $$-\pi/2\leq\theta(\omega), \phi(\omega)\leq\pi/2 \tag{Exp. 96}$$

At this juncture, it should be recalled that in the case of the first embodiment of the invention described previously, the optimal solution must be searched for given values of $\alpha_2'(\omega)$, $-\beta_1'(\omega)$, $-\beta_2'(\omega)$ and $\alpha_1'(\omega)$, respectively. By contrast, in the case of the second embodiment of the invention, the output signal can be searched from the predetermined range, as mentioned above, which means in turn that the output signal can be derived at higher speed when compared with the first embodiment of the invention.

Parenthetically, the expression Exp.88 can be rewritten in the form of:

$$F^{-1}(\omega) = \frac{1}{\Delta}\begin{bmatrix} \cos\phi(\omega) & -\sin\phi(\omega) \\ -\sin\theta(\omega) & \cos\theta(\omega) \end{bmatrix} \quad \text{(Exp. 97)}$$

where $$\Delta = \cos(\theta(\omega)+\phi(\omega)) \neq 0 \quad \text{(Exp. 98)}$$

Besides, from the expression Exp.74, here can be derived the undermentioned expression Exp.99.

$$G(\omega) = \begin{bmatrix} \cos\phi(\omega) & -\sin\phi(\omega) \\ -\sin\theta(\omega) & \cos\theta(\omega) \end{bmatrix} \quad \text{(Exp. 99)}$$

On the basis of the above condition, the first and second input signals superposed mutually can be separated with high fidelity.

Now, referring to the flow chart shown in FIG. 4, operation of the signal separation apparatus according to the second embodiment of the invention will be described.

In a step 21 shown in FIG. 4, the first filter module 29, the second filter module 30, the third filter module 31 and the fourth filter module 32 of the signal separation unit perform filtering processings on the first and second input signals received from the transmission channels section with given tap coefficient values which are selected arbitrarily from the transmission channel transfer function candidate values and which are represented respectively as follows:

$$\cos\phi'(\omega) \quad \text{(Exp. 9)}$$

$$-\sin\theta'(\omega) \quad \text{(Exp. 10)}$$

$$-\sin\phi'(\omega) \quad \text{(Exp. 11)}$$

$$\cos\theta'(\omega) \quad \text{(Exp. 12)}$$

In this conjunction, it is important to note that at this time point, the conditions given by the expressions Exp.89, Exp.90, Exp.91 and Exp.92 mentioned previously are not yet taken into consideration in selection or estimatrion of the tap coefficient values on the basis of the expressions Exp.9, Exp.10, Exp.11 and Exp.12.

The first difference calculation module 33 determines arithmetically the difference between the output signal of the first filter module 29 and that of the third filter module 31. Similarly, the second difference calculation module 34 determines the difference between the output signals of the second filter module 30 and the fourth filter module 32. See step 22 in FIG. 4.

Subsequently, in a step 23, the fifth filter module 35 performs filtering processing on the output signal of the first difference calculation module 33, while the sixth filter module 36 performs the filtering processing on the output signal of the second difference calculation module 34. In this case, when the output signals of the filter modules 35 and 36 are represented by $X_1'(\omega)$ (Exp.77) and $X_2'(\omega)$ (Exp.78) in the frequency-based notation while they are represented by $x_1'(t)$ (Exp.79) and $x_2'(t)$ (Exp.80) in the time-based notation, the following expression can be obtained.

$$X'(\omega) = \begin{bmatrix} X_1'(\omega) \\ X_2'(\omega) \end{bmatrix} \quad \text{(Exp. 81)}$$

The first and second autocorrelation calculation modules 37 and 38 of the evaluation function calculation unit are designed to determine arithmetically autocorrelations of the output signals from the fifth and sixth filter modules 35 and 36, respectively, to thereby output the inverse sign values of the autocorrelation (step 24).

More specifically, the signals outputted from the first and second autocorrelation calculation modules 23 and 24 can be represented, respectively, by the expressions Exp.82 and Exp.83 mentioned hereinbefore in conjunction with the first embodiment of the invention. Namely, $$-P_{x_1'x_1'}(\omega) = -E[X_1'(\omega) \cdot X_1'(\omega)] \quad \text{(Exp. 82)}$$

$$-P_{x_2'x_2'}(\omega) = -E[X_2'(\omega) \cdot X_2'(\omega)] \quad \text{(Exp. 83)}$$

On the other hand, the addition module 39 determines a sum of the output signals (Exp.82 and Exp.83) of the first and second autocorrelation calculation modules 37 and 38 (step 25). The absolute value calculation module 40 determines the absolute value of the output of the addition module 39 (step 26). The square calculation module 41 determines the square of the output of the absolute value calculation module 40 (step 27). Finally, the minimum value decision module 42 determines arithmetically a combination of the values $\theta'(\omega)$ (Exp.1) and $\phi'(\omega)$ (Exp.2) within the range of $x_2(t)$ (Exp.21) or $y_2(t)$ (Exp.23), which combination allows the output signal of the square calculation module 41 to assume a minimum value (step 28). At this juncture, it should also be mentioned that the first and second autocorrelation calculation modules 37 and 38, the addition module 39, the absolute value calculation module 40, the square calculation module 41 and the minimum value decision (selection) module 42 cooperate to constitute the evaluation function calculation unit or means of the apparatus according to the invention. The output signal J of the evaluation function calculation unit can thus be defined as follows:

$$J = \min|-P_{x_1'x_1'}(\omega) - P_{x_2'x_2'}(\omega)|^2 \quad \text{(Exp. 84)}$$

The above expression Exp. 84 can be developed to the following expression.

$$J = \min\frac{|-P_{v_1v_1}(\omega) - P_{v_2v_2}(\omega)|^2}{|\Delta|^2} \quad \text{(Exp. 100)}$$

At this juncture, it should be mentioned that provided $$\begin{bmatrix} V_1(\omega) \\ V_2(\omega) \end{bmatrix} = G(\omega)\begin{bmatrix} Y_1(\omega) \\ Y_2(\omega) \end{bmatrix} = G(\omega) \cdot F(\omega)\begin{bmatrix} X_1(\omega) \\ X_2(\omega) \end{bmatrix} \quad \text{(Exp. 101)}$$

the following expressions Exp. 102 and Exp. 103 apply valid.

$$P_{v_1v_1}(\omega) = |\cos(\theta+\phi')|^2|X_1|^2 + |\sin(\phi-\phi')|^2|X_2|1^2 \quad \text{(Exp. 102)}$$

$$P_{v_2v_2}(\omega) = |\sin(\theta-\theta')|^2|X_1|^2 + |\cos(\phi+\theta')|^2X_2|^2 \quad \text{(Exp. 103)}$$

From the above expressions Exp.102 and Exp.103, it is apparent that expressions Exp.104 and Exp.105 mentioned below apply valid when the value determined in accordance with the aforementioned expression Exp.100 becomes minimum. The denominator of Exp. 100 takes a fixed value. The minimum of Exp. 100 results with a minimum of the numerator having each component $Pv_1v_1$, $Pv_2v_2$ equal to zero. Namely, provided that $\theta'=\theta$, $$(\phi', X_1', X_2') = \begin{cases} (-\theta \pm \frac{\pi}{2}, \mp X_1, \mp X_2) \\ (\phi, X_1, X_2) \end{cases} \quad \text{(Exp. 104)}$$

whereas provided $\theta'=-\phi\pm\pi/2$, $$(\phi', X_1', X_2') = \begin{cases} (-\theta \pm \frac{\pi}{2}, \mp X_2, \mp X_1) \\ (\phi, X_1, X_2) \end{cases} \quad \text{(Exp. 105)}$$

However, taking into consideration the conditions for the inverse matrix (Exp.97) of the expression Exp.88 to exist, solutions given by the undermentioned expressions Exp.106 and Exp.107 can be derived. Namely, in the case $\theta'=\theta$(case i), $$(\phi', X_1', X_2')=(\phi, X_1, X_2) \quad \text{(Exp. 106)}$$

whereas in the case $\theta'=\phi\pm\pi/2$ (case ii), $$(\phi', X_1', X_2')=(-\theta\pm\pi/2, \mp X_2, \mp X_1) \quad \text{(Exp. 107)}$$

To say in another way, so far as the conditions given by the expression Exp.106 or alternatively Exp.107 are satisfied, the signal separation can be realized. In this conjunction, it can be said that in view of the conditions given by the expression Exp.96 mentioned hereinbefore, (a) $\theta'(\omega)$ (Exp.1) and $\phi'(\omega)$ (Exp.2) (angular components of trigonometric functions representing the transmission channel transfer functions) always assume true values when the values $\theta(\omega)$ (Exp.108) and $\phi(\omega)$ (Exp.109) are greater than $-\pi/2$ (Exp.110) inclusive and smaller than $\pi/2$ (Exp.111) inclusive, i.e., when $-\pi/2 \leq \theta(\omega), \phi(\omega) \leq \pi/2$, whereas (b) $\theta'(\omega)$ (Exp.1) and $\phi'(\omega)$ (Exp.2) always assume false values (virtual image values) when the values $\theta(\omega)$ and $\phi(\omega)$ are greater than $\pi/2$ (Exp.111) inclusive and smaller than $3\pi/2$ (Exp.112) inclusive, i.e., when $\pi/2<\theta(\omega), \phi(\omega)<3\pi/2$.

Thus, by using the values of the transfer functions of the transmission channels section which are given by the expressions Exp.9, Exp.10, Exp.11 and Exp.12 determined by the evaluation function calculation unit in accordance with the expression Exp.99 or Exp.100, filtering processings are performed on the input signals of two different systems transferred to the signal separation unit as represented by the expressions Exp.22 and Exp.23, respectively, by means of the filter modules 29, 30, 31 and 32 with the tap coefficient corresponding to the time-based notation of the relevant transfer functions, i.e., updated tap coefficients and not the arbitrarily selected tap coefficients (step 29).

The first difference calculation module 33 determines arithmetically the difference between the output signals of the first filter module 29 and the third filter module 31. Similarly, the second difference calculation module 34 determines arithmetically the difference between the output signals of the second filter module 30 and the fourth filter module 32. See step 30 in FIG. 4.

The processings in the steps 29 and 30 are equivalent to multiplication of the input signal (Exp.64) to the signal separation unit by the transfer function (Exp.99).

The fifth filter module 35 and the sixth filter module 36 perform filtering processings on the output signals of the first difference calculation module 33 and the second difference calculation module 34 with the tap coefficients corresponding to the time-based notation of the transfer function given by the expression Exp.13 (step 31).

Thus, through the processings in the steps 29, 30 and 31, the mutually superposed signals of two systems can be separated from each other, as can be seen from the expressions Exp.70 and Exp.85.

As is apparent from the foregoing, according to the teachings of the invention incarnated in the second embodiment, the signal separation processing can be realized even in the case where the transfer functions represented by the expressions Exp.16 and Exp.19 for the direct wave of the transmission channel have the zero point. Additionally, the transmission channel characteristics can be estimated at a high speed with significantly reduced computation overhead when compared with the first embodiment of the invention because the candidate values for estimation of the transfer functions of the transmission channels section are available within a finite range.

Many modifications and variations of the present invention are possible in the light of the above techniques. It is therefore to be understood that within the scope of the appended claims, the invention may be practiced otherwise than as specifically described.

What is claimed is:

1. In a signal transmission/reception system in which first and second signals originating in signal sources of two systems are transmitted to a receiver equipment provided with two input facilities, said first and second signals undergoing mutual interference due to crosstalk in their course of being transmitted through transmission channels section and being inputted to the respective input facilities of said receiver equipment, said receiver equipment comprises a signal separation apparatus comprising a signal separation section and an evaluation function calculating section, wherein said signal separation section comprises:
first and second filter means each of a variable tap coefficient type for performing filtering processing on a first input signal;
third and fourth filter means each of a variable tap coefficient type for performing filtering processing on a second input signal;
first difference calculation means for determining arithmetically difference between outputs of said first and third filter means;
second difference calculation means for determining arithmetically difference between outputs of said second and fourth filter means;
fifth filter means of a variable tap coefficient type for performing filtering processing on an output signal of said first difference calculation means; and
sixth filter means of a variable tap coefficient type for performing filtering processing on an output signal of said second difference calculation means; and wherein said evaluation function calculation section comprises:
first autocorrelation calculation means for determining arithmetically an inverse sign value of autocorrelation of an output signal of said fifth filter means;
second autocorrelation calculation means for determining arithmetically an inverse sign value of autocorrelation of an output signal of said sixth filter means;
addition means for adding together output values of said first and second autocorrelation calculation means;
absolute-value calculation means for determining an absolute value of an added output value of said addition means;

square calculation means for determining arithmetically a squared value of an absolute value outputted from said absolute value calculation means; and minimum value decision means for determining characteristics values of said transmission channels to obtain a minimum value from evaluation function values output from the square calculation means wherein the evaluation function values are determined arithmetically with respect to optional characteristics values of said transmission channels.

2. A signal separation apparatus according to claim 1, wherein said minimum value is determined by said minimum value decision means to determine components $\theta'(\omega)$ and $\phi'(\omega)$ in a predetermined range delimited by $-\pi/2$ and $\pi/2$ inclusive, whereby the tap coefficients of said filter means are updated in dependence on the selected components $\theta'(\omega)$ and $\phi'(\omega)$.

3. A method of separating first and second sequence signals input from transmission channels or paths, comprising the steps of:

(a) performing filtering processing on said first input signal with first and second filter means and performing processing on said second input signal with third and fourth filter means wherein said first, second, third and fourth filter means have respective controllable tap coefficient values in a frequency-based notation;

(b) performing difference calculation processings on output signals of said first filter means and said third filter means by first difference calculation means while performing difference calculation proceedings on output signals of said second filter means and said fourth filter means by second difference calculation means;

(c) performing filtering processing on output signals of said first and second difference calculation means, respectively, by fifth and sixth filter means each with a controllable tap coefficient value;

(d) determining arithmetically an inverse sign value of autocorrelation of an output signal of said fifth filter means by first autocorrelation calculation means while determining arithmetically an inverse sign value of autocorrelation of an output signal of said sixth filter means by second autocorrelation calculation means;

(e) adding together output signals of the first and second autocorrelation calculation means by addition means;

(f) determining arithmetically an absolute value of an output signal of said addition means by absolute value calculation means;

(g) determining arithmetically a square of an output absolute value of said absolute value calculation means by square calculation means;

(h) determining selectively a combination of tap coefficient values of said first, second, third and fourth filter means, respectively, so as to select a minimum evaluation function value in evaluation function values outputs of said square calculation means determined with optional tap coefficient values of said first, second, third and fourth filter means in a frequency-based notation;

(i) performing filtering processings by said first, second, third and fourth filter means with a combination of tap coefficient values determined in said step (h);

(j) performing difference calculation processing on output signals of said first and third filter means by said first difference calculation means, while performing difference calculation processing on output signals of said second and fourth filter means by said second difference calculation means; and (k) performing filtering processings on output values of said first and second difference calculation means, respectively, by said fifth and sixth filter means each an updated tap coefficient value, wherein said updated tap coefficient value mentioned in said step (k) is given by following Expression:

$$\frac{1}{\alpha'_1(\omega)\alpha'_2(\omega) - \beta'_1(\omega)\beta'_2(\omega)}$$

where $\alpha 2'(\omega)$ represents the tap coefficient value of said first filter means determined in said step (h), $-\beta 1'(\omega)$ represents the tap coefficient value of said second filter means determined in said step (h), $-\beta 2'(\omega)$ represents the tap coefficient value of said third filter means determined in said step (h), $\alpha 1'(\omega)$ represents the tap coefficient value of said fourth filter means determined in said step (h).

4. A method of separating first and second sequence signals input from transmission channels or paths, comprising the steps of:

(a) performing filtering processing on said first input signal with first and second, filter means and performing filtering processing on said second input signal with third and fourth filter means wherein said first, second, third and fourth filter means have respective controllable tap coefficient values in a frequency-based notation;

(b) performing difference calculation processings on output signals of said first filter means and said third filter means by first difference calculation means while performing difference calculation processings on output signals of said second filter means and said fourth filter means by second difference calculation means;

(c) performing filtering processing on output signals of said first and second difference calculation means respectively by fifth and sixth filter means each with a controllable tap coefficient value;

(d) determining arithmetically an inverse sign value of autocorrelation of an output signal of said fifth filter means by first autocorrelation calculation means while determining arithmetically an inverse sign value of autocorrelation of an output signal of said sixth filter means by second autocorrelation calculation means;

(e) adding together output signals of the first and second autocorrelation calculation means by addition means;

(f) determining arithmetically an absolute value of an output signal of said addition means by absolute value calculation means;

(g) determining arithmetically a square of an output absolute value of said absolute value calculation means by square calculation means;

(h) determining selectively a combination of frequency components of tap coefficient values of said first, second, third and fourth filter means, respectively, within a predetermined range so as to select a minimum evaluation function value in evaluation function values outputs of said square calculation means determined with optional tap coefficient values of said first, second, third and fourth filter means in a frequency-based notation;

(i) performing filtering processing by said first, second, third and fourth filter means with a combination of tap coefficient values determined in said step (h);

(j) performing difference calculation processing on output signals of said first and third filter means by said first difference calculation means, while performing difference calculation processing on output signals of said second and fourth filter means by said second difference calculation means; and (k) performing filtering processings on output values of said first and second difference calculation means, respectively, by said fifth and sixth filter means each with an updated combination of tap coefficient value, wherein said updated tap coefficient value mentioned in said step (k) is given by the following Expression:

$$\frac{1}{\cos\theta'(\omega)\cos\phi'(\omega) - \sin\theta'(\omega)\sin\phi'(\omega)}$$

where θ'(ω) and φ'(ω) represent the tap coefficient value frequency components, said predetermined range recited in said step (h) is given by from −π/2 to π/2, inclusive, cos φ'(ω) represents the tap coefficient value of said first filter means determined in said step (h), −sin θ'(ω) represents the tap coefficient value of said second filter means determined in said step (h), −sin φ'(ω) represents the tap coefficient value of said third filter means determined in said step (h), and cos θ'(ω) represents the tap coefficient value of said fourth filter means determined in said step (h).

5. A storage medium recording in the form of a program a signal separation method of processing by two input system to separate two original sequence signals subjected to mutual superposition in transmission channels or paths, thereby restoring the original sequence signals, said method comprising steps of:

(a) performing filtering processing on said first input signal with first and second, filter means and performing filtering processing on said second input signal with third and fourth filter means wherein said first, second, third and fourth filter means have respective controllable tap coefficient values in a frequence-based notation;

(b) performing difference calculation processings on output signals of said first filter means and said third filter means by first difference calculation means while performing difference calculation processings on output signals of said second filter means and said fourth filter means by second difference calculation means;

(c) performing filtering processing on output signals of said first and second difference calculation means, respectively, by fifth and sixth filter means each with a controllable tap coefficient value;

(d) determining arithmetically an inverse sign value of autocorrelation of an output signal of said fifth filter means by first autocorrelation calculation means while determining arithmetically an inverse sign value of autocorrelation of an output signal of said sixth filter means by second autocorrelation calculation means;

(e) adding together output signals of the first and second autocorrelation calculation by addition means;

(f) determining arithmetically an absolute value of an output signal of said addition means by absolute value calculation means;

(g) determining arithmetically a square of an output absolute value of said absolute value calculation means by square calculation means;

(h) determining selectively a combination of tap coefficient values of said first, second, third and fourth filter means, respectively, so as to select a minimum evaluation function value in evaluation function values outputs of said square calculation means determined with optional tap coefficient values of said first, second, third and fourth filter means in a frequency-based notation;

(i) performing filtering processings by said first, second, third and fourth filter means with a combination of tap coefficient values determined in said step (h);

(j) performing difference calculation processing on the output signals of said first and third filter means by said first difference calculation means, while performing difference calculation processing on output signals of said second and fourth filter means by said second difference calculation means; and (k) performing filtering processings on the output values of said first and second difference calculation means, respectively, by said fifth and sixth filter means each with an updated combination of tap coefficient value, wherein said updated tap coefficient value mentioned in said step (k) is given by following Expression:

$$\frac{1}{\alpha'_1(\omega)\alpha'_2(\omega) - \beta'_1(\omega)\beta'_2(\omega)}$$

where α2'(ω) represents the tap coefficient value of said first filter means determined in said step (h), −β1'(ω) represents the tap coefficient value of said second filter means determined in said step (h), −β2'(ω) represents the tap coefficient value of said third filter means determined in said step (h), α1'(ω) represents the tap coefficient value of said fourth filter means determined in said step (h).

6. A storage medium recording in the form of a program a signal separation method of processing by two input system to separate two original sequence signals subjected to mutual superposition in transmission channels or paths, thereby restoring the original sequence signals, said method comprising steps of:

(a) performing filtering processing on said first input signal with first and second filter means and performing filtering processing on said second input signal with third and fourth filter means wherein said first, second, third and fourth filter means have respective controllable tap coefficient values in a frequency-based notation;

(b) performing difference calculation processings on output signals of said first filter means and said third filter means by first difference calculation means while performing difference calculation processings on output signals of said second filter means and said fourth filter means by second difference calculation means;

(c) performing filtering processing on output signals of said first and second difference calculation means respectively by fifth and sixth filter means each with a controllable tap coefficient value;

(d) determining arithmetically an inverse sign value of autocorrelation of an output signal of said fifth filter means by first autocorrelation calculation means while determining arithmetically an inverse sign value of autocorrelation of an output signal of said sixth filter means by second autocorrelation calculation means;

(e) adding together output signals of the first and second autocorrelation calculation means by addition means;

(f) determining arithmetically an absolute value of an output signal of said addition means by absolute value calculation means;

(g) determining arithmetically a square of an output absolute value of said absolute value calculation means by square calculation means;

(h) determining selectively a combination of frequency components of tap coefficient values of said first, second, third and fourth filter means, respectively, within a predetermined range so as to select a minimum evaluation function value in evaluation function values outputs of said square calculation means determined with optional tap coefficient values of said first, second, third and fourth filter means in a frequency-based notation;

(i) performing filtering processing by said first, second, third and fourth filter means with a combination of tap coefficient values determined in said step (h);

(j) performing difference calculation processing on the output signals of said first and third filter means by said first difference calculation means, while performing difference calculation processing on output signals of said second and fourth filter means by said second difference calculation means; and (k) performing filtering processings on output values of said first and second difference calculation means, respectively, by said fifth and sixth filter means each with an updated combination of tap coefficient value, wherein said updated tap coefficient value mentioned in said step (k) is given by the following Expression:

$$\frac{1}{\cos\theta'(\omega)\cos\phi'(\omega) - \sin\theta'(\omega)\sin\phi'(\omega)}$$

where $\theta'(\omega)$ and $\phi'(\omega)$ represent the tap coefficient value frequency components, said predetermined range recited in said step (h) is given by from $-\pi/2$ to $\pi/2$, inclusive, $\cos \phi'(\omega)$ represents the tap coefficient value of said first filter means determined in said step (h), $-\sin \theta'(\omega)$ represents the tap coefficient value of said second filter means determined in said step (h), $-\sin \phi'(\omega)$ represents the tap coefficient value of said third filter means determined in said step (h), and $\cos \theta'(\omega)$ represents the tap coefficient value of said fourth filter means determined in said step (h).

\* \* \* \* \*

UNITED STATES PATENT AND TRADEMARK OFFICE
CERTIFICATE OF CORRECTION

PATENT NO. : 6,704,369 B1
DATED : September 8, 2004
INVENTOR(S) : Naoto Kawasaki et al.

It is certified that error appears in the above-identified patent and that said Letters Patent is hereby corrected as shown below:

Title page,
Item [73], Assignee, after "Osaka (JP)" insert -- , part interest --.

Signed and Sealed this

Fifteenth Day of March, 2005

JON W. DUDAS
*Director of the United States Patent and Trademark Office*